United States Patent
New

(10) Patent No.: US 6,720,810 B1
(45) Date of Patent: Apr. 13, 2004

(54) DUAL-EDGE-CORRECTING CLOCK SYNCHRONIZATION CIRCUIT

(75) Inventor: Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/173,212

(22) Filed: Jun. 14, 2002

(51) Int. Cl.$^7$ ................................................. H03L 7/06
(52) U.S. Cl. ..................................... 327/158; 327/159
(58) Field of Search ................................ 327/149, 150, 327/152, 153, 158, 159, 161, 141, 144

(56) References Cited

U.S. PATENT DOCUMENTS

| | | | | |
|---|---|---|---|---|
| 4,604,582 A | * | 8/1986 | Strenkowski et al. | 327/147 |
| 5,118,975 A | * | 6/1992 | Hillis et al. | 327/158 |
| 5,428,309 A | * | 6/1995 | Yamauchi et al. | 327/158 |
| 5,815,016 A | * | 9/1998 | Erickson | 327/158 |
| 5,828,257 A | * | 10/1998 | Masleid | 327/276 |
| 5,838,179 A | * | 11/1998 | Schmidt | 327/156 |
| 5,999,025 A | | 12/1999 | New | 327/156 |
| 6,072,347 A | * | 6/2000 | Sim | 327/276 |
| 6,072,348 A | | 6/2000 | New et al. | 327/295 |
| 6,184,733 B1 | * | 2/2001 | Wang et al. | 327/157 |
| 6,191,613 B1 | | 2/2001 | Schultz et al. | 326/39 |
| 6,289,068 B1 | | 9/2001 | Hassoun et al. | 375/376 |
| 6,373,308 B1 | | 4/2002 | Nguyen | 327/161 |

OTHER PUBLICATIONS

Shih–Lien Lu, Milos Ercegovac; "A Novel CMOS Implementation of Double–Edge–Triggered Flip–Flops"; IEEE Journal of Solid–State Circuits, vol. 25, No. 4; Aug. 1990; pp. 1008–1010.

M. Afghahi, J. Yuan; "Double Edge–Triggered D–Flip–Flops for High–Speed CMOS Circuits"; IEEE Journal of Solid–State Circuits, vol. 26, No. 8; Aug. 1991; pp. 1168–1170.

Stephen H. Unger; "Double–Edge–Triggered Flip–Flops"; IEEE Transactions on Computers, vol. C–30, No. 6; Jun. 1981; pp. 447–451.

* cited by examiner

Primary Examiner—Tuan T. Lam
(74) Attorney, Agent, or Firm—Arthur J. Behiel

(57) ABSTRACT

A clock distribution circuit and method in which the incoming clock frequency is divided by two to create a reduced-frequency global clock signal. A dual-edge-correcting clock synchronization circuit aligns both the rising and falling edges of the global clock signal to separately to nullify the clock-distribution errors associated with rising and falling clock edges.

14 Claims, 2 Drawing Sheets

DUAL-EDGE-CORRECTING CLOCK SYNCHRONIZATION CIRCUIT

FIELD OF THE INVENTION

The invention relates to integrated circuits (ICs). More particularly, the invention relates to methods and apparatus for reducing power dissipation in IC clock distribution networks.

BACKGROUND

Distributing clock signals on integrated circuits dissipates a significant amount of power, and the power dissipated increases with clock frequency. Dividing the clock by two, distributing the resulting half-speed clock, and equipping the IC with synchronous elements that respond to both rising and falling edges of the half-speed clock reduces the dissipated power. M. Afghahi and J. Yuan propose circuits that employ this method to reduce dissipated power in "Double Edge-Triggered D-Flip-Flops for High-Speed CMOS Circuits," IEEE Journal of Solid-State Circuits, pages 1168–1170, Vol. 26, No. 8, August 1991, which is incorporated herein by reference. A number of other authors describe double-edge-triggered flip-flops, including Stephen H. Unger in "Double-Edge-Triggered Flip-Flops," IEEE Transactions on Computers, Vol. C-30, No. 6, pages 447–451, June 1981; and Shih-Lien Lu and Milos Ercegovac in "A Novel CMOS Implementation of Double-Edge-Triggered Flip-Flops," IEEE Journal of Solid-State Circuits, Vol. 25, No. 4, August 1990, pages 1008–1010; both of which are incorporated herein by reference.

FIG. 1, taken from U.S. Pat. No. 6,072,348 to New et al., shows a clock distribution circuit 100 for an FPGA in which the frequency of an incoming reference clock signal CK is optionally divided by two and distributed at the new, lower frequency to reduce power consumption. The clock distribution circuit comprises a programmable clock divider 101, a clock distribution network 103, and a programmable double-edge flip-flop 105. Flip-flop 105 is typically one of many clock destinations on clock distribution network 103. The above-mentioned patent to New et al. is incorporated herein by reference.

Clock divider 101 includes a single-edge flip-flop 110, a multiplexer 115, and an inverter 120. Flip-flop 110 and multiplexer 115 each receive clock signal CK. The output of flip-flop 110 feeds back through inverter 120 to the data input D of flip-flop 110, thereby forming a clock divider that divides the clock frequency of clock signal CK by two. The output of flip-flop 110 also drives one input of multiplexer 115. A configurable memory cell 125 selects one or the other input of multiplexer 115, and consequently provides a global clock signal GCK with either the same frequency as clock CK (when multiplexer 115 selects clock line CK) or one-half of that frequency (when multiplexer 115 selects the output of flip-flop 110). Clock distribution network 103 distributes global clock signal GCK to a number of other programmable flip-flops, including flip-flop 105.

Each programmable flip-flop includes a configuration memory cell 130. The bit stored in configuration memory cell 130 (i.e., a logic one or a logic zero) determines whether the associated flip-flop exhibits either single-edge or double-edge functionality. A single memory cell 130 can control more than one flip-flop.

A problem encountered with the scheme of FIG. 1 is that clock distribution network 103 may exhibit different propagation delays for falling and rising edges, due to unbalanced driver circuits, for example. Synchronous logic elements (e.g., flip-flop 105) may therefore have more or less time to settle in alternate half cycles of the distributed clock. To ensure proper operation, the synchronous elements should settle in the shorter half cycle: the additional time in the longer half cycle is wasted, reducing speed performance.

SUMMARY

The invention provides a clock distribution circuit and method in which the incoming clock frequency is divided by two to create a reduced-frequency global clock signal. A dual-edge-correcting clock synchronization circuit (e.g., a delay-locked loop) aligns both the rising and falling edges of the global clock signal to separately nullify the clock-distribution delays associated with rising and falling clock edges. The resulting improvement in clock accuracy facilitates greater clock speeds, and consequently improves speed performance.

This summary does not limit the invention, which is instead defined by the claims.

DETAILED DESCRIPTION

Figure 1:
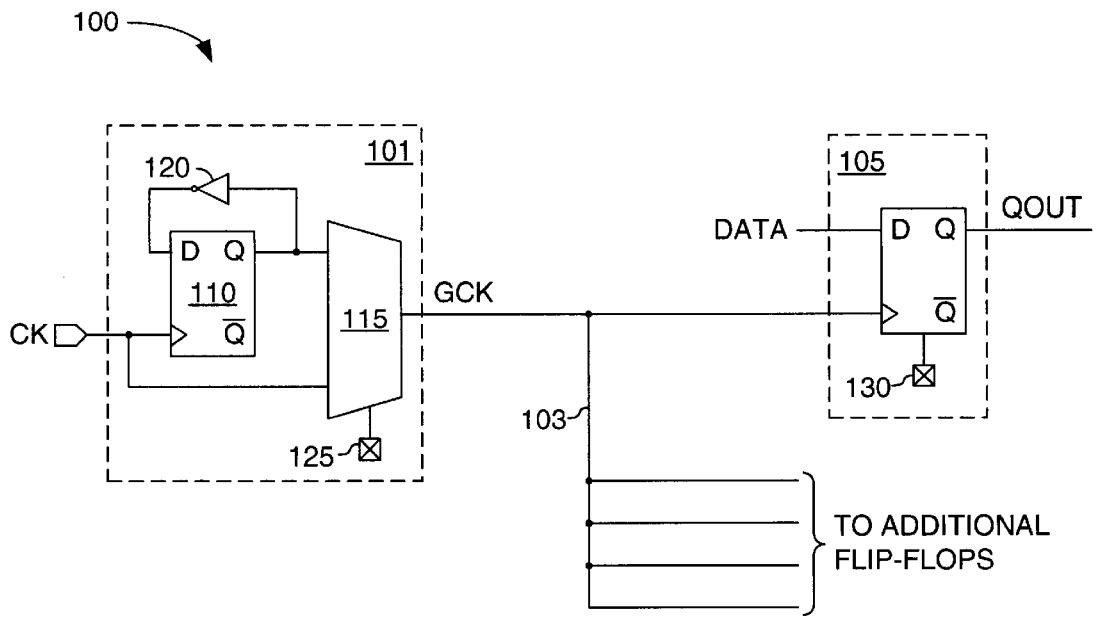
FIG. 1 (prior art) shows a clock distribution circuit for an FPGA in which an incoming clock frequency is optionally divided by two and distributed at the new, lower frequency to reduce power consumption.

Clock synchronization circuits, including phase-locked loops (PLLs) and delay-locked loops (DLLs), are commonly used to nullify clock-distribution errors. Conventional synchronization circuits, however, only control the position of one distributed clock edge (e.g., the rising edge) relative to the input clock. In a clock-halving scheme like the one described above in connection with FIG. 1, both edges of the distributed clock affect system timing, and should therefore be aligned with the input clock. Embodiments of the invention address this need with a dual-edge-correcting DLL.

Figure 2:
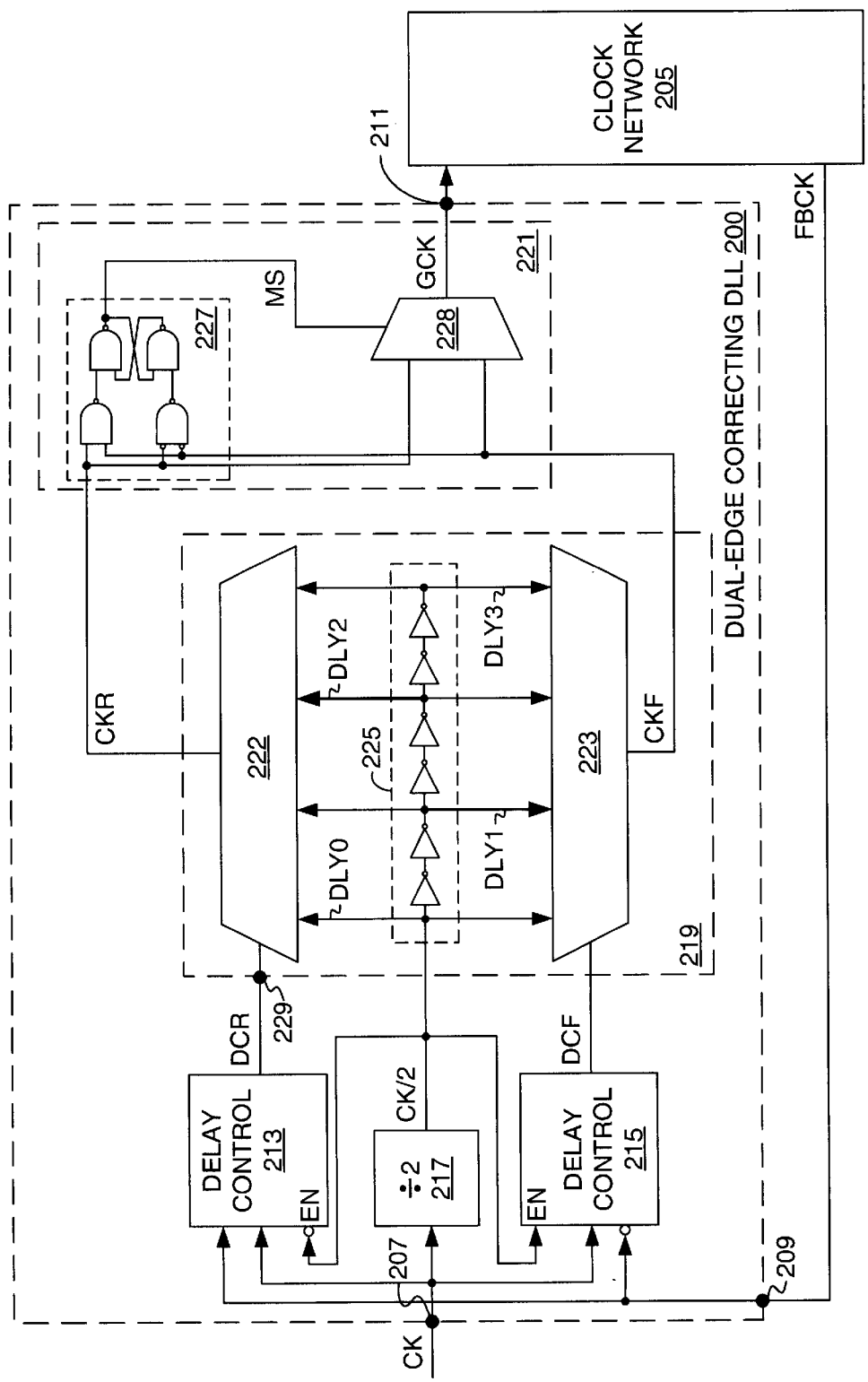
FIG. 2 depicts a dual-edge-correcting delay-locked loop (DLL) 200 in accordance with one embodiment of the invention.

FIG. 2 depicts a dual-edge-correcting DLL 200 in accordance with one embodiment of the invention. DLL 200 conventionally receives as inputs a clock signal CK on a clock input terminal 207 and a feedback-clock signal FBCK from clock network 205 on the second input terminal 209. DLL 200 employs these signals to produce a global clock signal GCK to clock network 205 via an output terminal 211. Signals and their respective nodes, lines, or terminals are referred to herein using the same designations.

DLL 200 includes a pair of delay control circuits 213 and 215, a divide-by-two counter 217, a delay adjustment circuit 219, and a clock-combining circuit 221. Delay adjustment circuit 219 includes a pair of multiplexers 222 and 223 connected to respective ones of delay control circuits 213 and 215. Delay adjustment circuit 219 additionally includes a conventional delay line 225, a series of inverters. Clock-combining circuit 221 includes a latch 227 and a multiplexer 228. The operation of DLL 200 is described below in connection with FIG. 3.

Fundamentally, DLL 200 combines two single-edge-correcting synchronization circuits that operate alternately to align both the rising and falling edges of a half-speed clock signal CK/2 on a like-named clock node. The first single-edge-correcting synchronization circuit includes delay control circuit 213 and multiplexer 222, while the second single-edge-correcting synchronization circuit includes delay control circuit 215 and multiplexer 223. Both single-edge-correcting synchronization circuits share delay line 225.

Delay adjustment circuit 219 produces a pair of adjusted clock signals CKR and CKF that are of the same frequency as clock signal CK/2; however, clock signal CKR is delay adjusted to compensate for the rising-edge delay of feedback clock signal FBCK, and clock signal CKF is delay adjusted to compensate for the falling-edge delay of feedback clock signal FBCK. Clock combining circuit 221 combines clock signals CKR and CKF to produce global clock signal GCK. Clock signals CKR and CKF are combined in such as way that the global clock signal GCK is delay adjusted to separately compensate for rising- and falling-edge delays on feedback clock signal FBCK.

Figure 3:
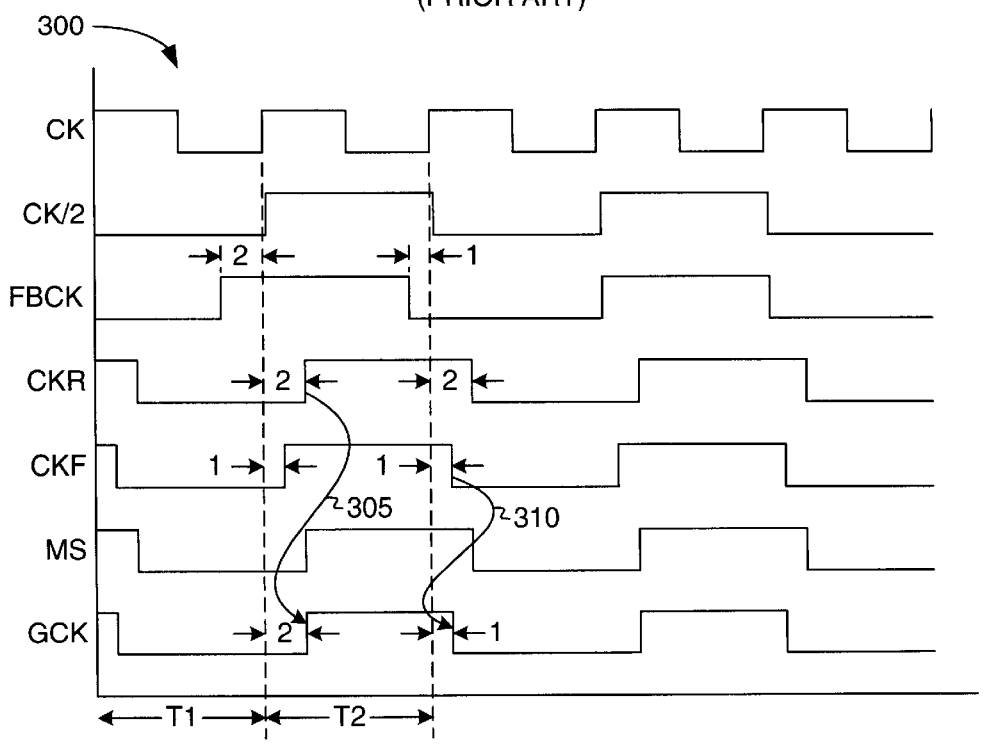
FIG. 3 is a waveform diagram 300 used in connection with FIG. 2 to illustrate the operation of DLL 200.

FIG. 3 is a waveform diagram 300 used in connection with FIG. 2 to illustrate the operation of DLL 200. As noted above, clock network 205 may exhibit different propagation delays for falling and rising edges. Diagram 300 illustrates a case in which feedback clock FBCK arrives at input terminal 209 two delay increments before a rising edge on clock line CK, and a falling edge on feedback line FBCK arrives at input terminal 209 just one delay increment before the next rising edge on line CK. The delay increments are illustrative, and have no particular magnitude in the present example. For ease of illustration, one delay increment is assumed to be the delay between adjacent output nodes of delay line 225.

During the first period T1 of clock signal CK, the logic zero on signal CK/2 enables delay-control circuit 213. Delay control circuit 213 thus compares the rising edge of the input clock signal CK with a corresponding rising edge of the feedback clock FBCK during time T1. Delay control circuit 213 conventionally develops an error-correction factor having a magnitude corresponding to the delay between the two rising edges. The error-correction factor is passed from delay control circuit 213 on a delay control port DCR to a delay-adjustment input port 229 of delay adjustment circuit 219. ("DCR" stands for "delay-control rising" because delay control circuit 213 adjusts the timing of rising edges.)

The error-correction factor on control port DCR is a binary number to the select terminals of multiplexer 222 that selects an appropriate output node of delay line 225. In the example, the delay between the rising edge on the feedback clock and the associated rising edge on the input clock on line CK is two delay units, so the error-correction factor is two. Multiplexer 222 thus selects delay line output DLY 2, and consequently imposes a delay of the two units on the clock signal CK/2. Delay adjustment circuit 219 provides the resulting corrected clock signal CKR to an input terminal of clock-combining circuit 221.

Delay control circuit 215 and the associated multiplexer 223 work in much the same way as delay control circuit 213 and associated multiplexer 222. However, delay control circuit 215 and multiplexer 223 operate to align falling edges of feedback clock signal FBCK on terminal 209 with rising edges of clock signal CK. Returning to FIG. 3, delay control circuit 215 is active during period T2 because the logic one on clock line CK/2 enables,delay-control circuit 215. Consequently, delay control circuit 215 compares the next rising edge on input clock CK with an associated falling edge of feedback clock signal FBCK. Delay-control circuit 215 includes an inverting input for feedback clock FBCK. In the example, feedback clock FBCK exhibits a falling edge one delay period before the associated rising edge on clock signal CK. Delay-control circuit 215 thus provides an error-correction factor on a delay control port DCF of delay control circuit 215 that causes multiplexer 223 to select output terminal DL1 from delay line 225 to impose one unit of delay. The resulting adjusted clock signal CKF from multiplexer 223 is a duplication of the divided clock signal on line CK/2 but delayed by one increment. The output signal from multiplexer 223 is labeled CKF, which stands for "clock falling," to indicate that the signal from multiplexer 223 is a clock signal for aligning the falling edges of the feedback clock on line FBCK with alternate rising edges on input line CK.

Because clock signal CKR is adjusted to compensate for rising-edge delays and clock signal CRF is adjusted to compensate for falling-edge delays, clock-combining circuit 221 can combine these signals to create a single clock signal (global clock signal GCK) in which the rising and falling edges are separately adjusted as appropriate to correct for the different delays associated with rising and falling edges of the feedback clock FBCK.

In the depicted embodiment, both the rising and falling edges of the global clock signal GCK are aligned to rising edges of the clock signal on input line CK; however, DLL 200 can easily be modified so both the rising and falling edges of the global clock are aligned to falling edges of the clock signal. In other embodiments, the input clock is provided at the desired frequency for the global clock, eliminating the need for clock divider 217.

The output line MS of latch 227 connects to the select terminal of multiplexer 228. Signal MS transitions from a logic zero to a logic one after both clock signals CKR and CKF transition to a logic one, and then returns to a logic zero after both clock signals CKR and CKF return to logic zero. Having both inputs to multiplexer 228 at the same logic level prior to switching prevents glitches on global clock line GCK. When signal MS is a logic zero, global clock signal GCK is the delay-adjusted clock CKR that is delayed the appropriate amount to adjust for the rising-edge delay error of feedback clock signal FBCK. The rising edge on adjusted clock line CKR thus causes global clock signal GCK to go high (arrow 305), and at the same time causes latch 227 to transition so that multiplexer 228 selects the delay-adjusted clock CKF that provides the appropriate delay correction for falling edges on the feedback clock FBCK. Thus, when delay-adjusted clock CKF transitions from high to low, so too does global clock signal GCK (arrow 310). In this way, global clock signal GCK is adjusted to impose an additional two units of delay on rising edges and one unit of delay on falling edges to correct for the errors identified by delay control circuits 213 and 215, respectively.

Diagram 300 shows the delay correction occurring in less than a clock cycle. This simplification is for brevity; in practice, the correction process typically requires a number of clock cycles. It will be apparent to those of skill in the art, however, that feedback clock signal FBCK at the inputs of delay control circuits 213 and 215 will eventually be coincident, or nearly so, with the divided clock signal on line CK/2. The delay granularity of delay line 225 will largely determine the precision of the coincidence. DLL 200 is also simplified for brevity. Conventional DLLs can include many additional features, as will be understood by those of skill in the art. For a more detailed discussion of a suitable DLL that can be modified in accordance with an embodiment of the invention to provide a dual-edge-correcting DLL, see U.S.

Pat. No. 6,373,308 to Andy T. Nguyen, issued Apr. 16, 2002, which is incorporated herein by reference.

While the present invention has been described in connection with specific embodiments, variations of these embodiments will be obvious to those of ordinary skill in the art. For example, embodiments of the invention can include other types of feedback-controlled clock synchronization circuits, such as phase-locked loops (PLLs), in place of DLLs to align rising and falling clock edges. Such an embodiment may use clock divider and clock-combining circuits similar to those of FIG. 2, but employ a pair of PLLs to lock to the rising and falling clock edges. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A dual-edge-correcting clock synchronization circuit comprising:
   a. a clock divider circuit receiving a clock signal;
   b. a rising-edge correcting synchronization circuit having a first synchronization-circuit input terminal connected to the clock divider circuit and a first synchronization-circuit output terminal providing a rising-edge corrected clock signal;
   c. a falling-edge correcting synchronization circuit having a second synchronization-circuit input terminal connected to the clock divider circuit and a second synchronization-circuit output terminal providing a falling-edge corrected clock signal; and
   d. a clock-combining circuit having first and second clock-combining-circuit input terminals and a clock-combining-circuit output terminal, wherein the first and second clock-combining-circuit input terminals are connected to the respective first and second synchronization-circuit output terminals.

2. The dual-edge-correcting clock synchronization circuit of claim 1, wherein the clock-combining circuit combines the rising-edge and falling-edge corrected clock signals to produce an uninterrupted global clock signal on the clock-combining-circuit output terminal.

3. The dual-edge-correcting clock synchronization circuit of claim 1, wherein the rising-edge correcting synchronization circuit includes a first feedback terminal connected to the clock-combining-circuit output terminal via a clock network to receive a feedback clock signal derived from the global clock signal and the falling-edge correcting synchronization circuit includes a second feedback terminal connected to the clock-combining-circuit output terminal via the clock network to receive the feedback clock signal.

4. The dual-edge-correcting clock synchronization circuit of claim 3, wherein the rising-edge correcting synchronization circuit includes a first delay control circuit for developing a first error correction factor in response to the feedback clock signal and the clock signal and the falling-edge correcting synchronization circuit includes a second delay control circuit for developing a second error correction factor in response to the feedback clock signal and the clock signal.

5. The dual-edge-correcting clock synchronization circuit of claim 4, wherein the feedback clock signal includes rising and falling clock edges, the first delay control circuit develops the first error correction factor in response to the rising edges of the feedback clock signal, and the second delay control circuit develops the second error correction factor in response to the falling edges of the feedback clock signal.

6. The dual-edge-correcting clock synchronization circuit of claim 4, wherein the first delay control circuit compares the rising edges of the feedback clock signal to rising edges of the clock signal and the second delay control circuit compares the falling edges of the feedback clock signal to rising edges of the clock signal.

7. The dual-edge-correcting clock synchronization circuit of claim 1, wherein at least one of the first and second single-edge-correcting synchronization circuits comprises a delay line.

8. The dual-edge-correcting clock synchronization circuit of claim 1, wherein the rising-edge corrected clock signal is corrected independently from the falling-edge corrected clock signal.

9. A method of synchronizing a reference clock signal with a feedback-clock signal, the feedback-clock signal including a sequence of rising and falling edges, the method comprising:
   a. comparing a first series of edges of the reference clock signal with the rising edges of the feedback-clock signal to produce a first error-correction factor wherein the reference clock signal comprises a frequency divider clock signal; and
   b. comparing a second series of edges of the reference clock signal with the falling edges of the feedback-clock signal to produce a second error-correction factor.

10. The method of claim 9, wherein the first series of edges are rising edges and the second series of edges are falling edges.

11. The method of claim 9, further comprising adjusting the timing of the rising edges of the feedback signal in response to the first error-correction factor and independently from the adjusting of the timing of the falling edges, adjusting the timing of the falling edges of the feedback signal in response to the second error-correction factor.

12. A dual-edge-correcting clock synchronization circuit comprising:
   a. a clock terminal adapted to provide a clock signal, the clock terminal connected to a clock divider circuit;
   b. a feedback-clock terminal receiving a feedback-clock signal;
   c. a first single-edge-correcting synchronization circuit having:
      i. a first synchronization-circuit input terminal connected to the clock terminal;
      ii. a second synchronization-circuit input terminal connected to the feedback-clock terminal; and
      iii. a first control port;
      iv. wherein the first single-edge-correcting synchronization circuit provides, on the first control port, a first control signal derived from a first synchronization error between a rising edge on the first synchronization-circuit input terminal and a rising edge on the second synchronization-circuit input terminal; and d. a second single-edge-correcting synchronization circuit having:
   i. a third synchronization-circuit input terminal connected to the clock terminal;
   ii. a fourth synchronization-circuit input terminal connected to the feedback-clock terminal; and
   iii. a second control port;
   iv. wherein the second single-edge-correcting synchronization circuit provides, on the second control port, a second control signal derived from a second synchronization error between a falling edge on the third synchronization circuit input terminal and a falling edge on the fourth synchronization circuit input terminal.

13. The dual-edge-correcting synchronization circuit of claim 12, wherein at least one of the first and second single-edge-correcting synchronization circuits comprises a delay line.

14. The dual-edge-correcting synchronization circuit of claim 13, wherein the clock divider circuit comprises a clock signal frequency divided by two.

* * * * *